United States Patent [19]

Molodnyakov et al.

[11] Patent Number: 4,588,671

[45] Date of Patent: May 13, 1986

[54] PHOTO AND ELECTRON RESIST WITH DONOR-ACCEPTOR COMPLEX AND LIGHT SENSITIVE COMPOUND

[75] Inventors: Sergei P. Molodnyakov; Jury I. Fedorov; Vitaly A. Kuznetsov; Alexei N. Egorochkin; Tamara G. Birjukova; Grigory A. Razuvaev, all of Gorky, U.S.S.R.

[73] Assignee: Institut Khimii Akademii Nauk SSSR, U.S.S.R.

[21] Appl. No.: 522,173

[22] PCT Filed: Dec. 21, 1981

[86] PCT No.: PCT/SU81/00078

§ 371 Date: Aug. 1, 1983

§ 102(e) Date: Aug. 1, 1983

[87] PCT Pub. No.: WO83/02339

PCT Pub. Date: Jul. 7, 1983

[51] Int. Cl.$^4$ .................. G03C 1/60; G03F 7/26
[52] U.S. Cl. .................. 430/191; 430/165; 430/189; 430/190; 430/192; 430/296; 430/326
[58] Field of Search ............. 430/191, 190, 189, 165, 430/326, 296

[56] References Cited

U.S. PATENT DOCUMENTS

| | | | |
|---|---|---|---|
| 3,567,453 | 3/1971 | Borden | 430/191 |
| 3,615,532 | 10/1971 | Silver | 430/191 |
| 3,661,582 | 5/1972 | Broyde | 430/191 |
| 3,948,667 | 4/1976 | Ichikawa et al. | 430/197 |
| 4,296,190 | 10/1981 | Hasegawa et al. | 430/96 |
| 4,356,255 | 10/1982 | Tachikawa et al. | 430/191 |
| 4,365,019 | 12/1982 | Daly et al. | 430/191 |

FOREIGN PATENT DOCUMENTS

| | | | |
|---|---|---|---|
| 53-108421 | 9/1978 | Japan | 430/495 |
| 56-147146 | 11/1981 | Japan | 430/145 |
| 8000312 | 8/1981 | Netherlands | 430/302 |
| 332413 | 3/1972 | U.S.S.R. | 430/192 |

OTHER PUBLICATIONS

"Photolithography for Manufacture of Semiconductor Devices", with English translation F. P. Press, Energia Publ., Moscow, 1968, pp. 35 and 40.

Primary Examiner—Charles L. Bowers, Jr.
Attorney, Agent, or Firm—Steinberg & Raskin

[57] ABSTRACT

A photo- and electron resist distributed in an organic solvent, and including an additive which forms a donor-acceptor complex to eliminate luminescence effects and increase the stability of the resist.

The photo- and electron resist can be used in microelectronics, optics, printing and precision machine building industry when resists are employed to manufacture structures of semiconductor devices and solid-state circuits.

5 Claims, No Drawings

PHOTO AND ELECTRON RESIST WITH DONOR-ACCEPTOR COMPLEX AND LIGHT SENSITIVE COMPOUND

BACKGROUND OF THE INVENTION

The invention relates to photography, and more particularly to photolithography art concerned with photo- and electron-resists.

Known in the art are two types of polymeric photo-electron-resists as follows: positive and negative.

The commercially available positive photo-resists are compositions containing, (a), sulphoethers of 1,2-(2,1)-naphthodiazoquinones, which are the products formed through condensatioon of phenols with formaldehyde, (b), novolac and resol-novolac resins, and, (c), organic solvents such as dioxane and dimethylformamide, with a ratio by weight of about 18:12:80, respectively (cf. F. P. Press, Photolithography for Manufacture of Semiconductor Devices,Energia Publ., Moscow, 1968, p. 40). The positive photo-resists are susceptible to actinic light, including ultraviolet rays, electron beams and X-rays. Their basic property is that they change their physical-chemical properties under the action of the above radiation, with the result that the exposed film becomes more soluble in alkali solutions.

The known negative photo-resists are generally represented by a group having the structure

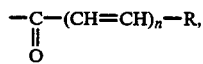

where R is $C_6H_5$ and n is an integer from 1 to 5, some particular compositions containing, for example, the derivative of the polyesters of cinnamic, phenylbutadiene- and phenyl-hexatrienecarboxylic acids other unsaturated acids as well as copolymers of vinyl oxycinnamate, $\beta$-vinyl oxyethylcinnamate and vinyl acetate and styrene. When such resists are subject to actinic light, cross-linked structures are produced which become less soluble in certain organic solvents (cf. ibid., p.35). The negative photo-resists comprise, in addition to the light-sensitive agents, sensitizers such as Michler ketone, derivatives of anthraquinones and nitro compounds, and organic solvents, for example, toluene, chlorobenzene, derivative, and dioxane. The herein described constituents are employed in a ratio by weight of 3–5:0.3–0.5:94.5–96.5, respectively.

The known photo-resists have a resolution of about 300–500 lines/mm for layer thicknesses from 0.3 to 0.4 $\mu$m.

The described photo-resists are disadvantageous in that they yield, during illumination, secondary fluorescence and phosphorescence effects. Since the rays so produced tend to propagate in all directions and possess an energy of about 3 eV, there results a photochemical reaction even at the places covered with the dark field of the mask and the linear dimensions of the components are increased up to 0.15–0.2 $\mu$m on each side in the case of positive photo-resists.

The negative photo-resists behave similarly with the exception that an increase in the size of the exposed zone results from a decrease in the non-exposed sections of the resist film, which are washed off during development.

It is known that the resolution provided by light exposure depends on the wavelength of actinic light and generally amounts to 0.3–0.4 $\mu$m. This figure represents a theoretically predicted limit for light exposure, which cannot be achieved by the use of the present-day contact method. On the other hand, components of smaller size can be obtained with electron beams. In this case, however, the results achieved in practice are considerably inferior to those provided by theoretical predictions and the smallest sizes of the components after development exceed by the value of the order the diameter of the focused electron beam. The width of the line obtained during the exposure by a movable electron beam of a minimal size will be greater than the beam diameter due to luminescence effect, the scattering of the elecrons impinging on the resist and the reflection of them from the substrate. Note that the line width greatly depends on the thickness of the resist layer. In the case of electron-resists, luminescence is mainly responsible for a distortion of component dimensions, especially for the thickness of resist layers ranging from 0.4 to 1.0 $\mu$m. In addition, the stability of photo- and electron-resists is considerably influenced by the side reactions occurring in the solutions and the films based on them. These reactions result in a change of the molecular weight and viscosity, in the formation of cross-linked and degraded structures, and also in the interaction of the resists components and the products of partial degradation thereof with solvents, minute admixtures and atmospheric oxygen. There remains therefore a compelling need for an increase in the resist shelf life, which usually equals about 3–6 months, so as to achieve at least one-year shelf life. Within that period of time, the following properties of resists should be kept invariable: resolution; reproducible image edges; light sensitivity; and stability.

SUMMARY OF THE INVENTION

An object of the invention is to provide a photo- and electron-resist comprising constituents capable of eliminating fluorescence and phosphorescence effects during the exposure step so that the resist is given greater resolving power along with higher sharpness of the edges of the submicron- and micro-size structures of the elements of the produced image and greater stability in time as well.

There is provided a photo- and electron-resist comprising a light-sensitive compound, a film-forming compound and an organic solvent, which resist also comprises, according to the invention, an additive forming a donor-acceptor complex with the above-mentioned compounds and the reaction products of the latter, said complex resisting luminescence effect and increasing resist stability.

Preferably, the photo- and electron-resist should comprise any one of the following constituents used for said additive: iodine; tetracyanoethylene; trinitrophenol; tetracyanoquinodimethane; parachloranil; and parabromanil.

With the present invention, it is possible to obtain in the resists exposed by the contact or the projecting method lengthwise (up to 3 mm) elements of the structures of the produced image, said elements having micron (1.0 $\mu$m) and submicron (up to 0.5 $\mu$m) size and similar gaps, and the irregularities of the element edges amounting to not more than 0.1 $\mu$m for resists from 0.5 to 1.0 $\mu$m thick. These results are valid for resists with a one-year shelf life and with working field areas up to 60–80 mm.

Advantageously, a positive resist should comprise from 5-10 weight percent of the components of o- and p-benzo- and naphthodiazoquinones or iminodiazoquinones and their derivatives, from 10 to 15 weight percent phenol- (α-naphthol)-aldehyde resin and its derivatives, from 0.1 to 3.0 weight percent of an additive, and from 78 to 84.9 w weight percent of an organic solvent.

Preferably, a negative resist should comprise from 5 to 10 weight percent of an oligomeric, polymeric or copolymeric compound containing a group having the structure

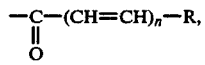

wherein R is alkyl containing from 1 to 11 carbon atoms, or its derivatives, from 0.5 to 1.0 weight percent of a sensitizer, from 0.1 to 3.0 weight percent of an additive, and from 86 to 94.4 weight percent of an organic solvent.

DETAILED DESCRIPTION OF THE PREFERRED EMBODIMENTS

The negative and positive photo- and electron-resist of the invention comprises a light-sensitive compound, a film-forming compound, a sensitizer, an organic solvent, and an additive that forms a donor-acceptor complex with the above-mentioned constituents and their reaction products, said complex being used to cancel luminescence effect and increase the resist stability.

The formation of a donor-acceptor complex is acknowledged by the presence of certain spectral lines represented by an extra absorption band in the ultraviolet region, at 288–308 nm and 364–370 nm. That band is not present in the spectra of the source compounds and the position and intensity of the absorption peak depends on the exposure time. After the complex-forming additives have been introduced into the solution, luminescence disappears, with the result that the element dimensions do not change (the contour lines do not broaden) both in positive and negative resists. The additive should amount to not more than 15 weight percent (preferably from 0.15 to 5 weight percent) of the combined weight of the dry constituents of the resist. The following substances can be used for the additive: iodine; tetracyanoethylene; trinitrophenol; tetracyanoquinodinothane parachloranil; or parabromanil. Any of these substances or compositions thereof allows for complete elimination of luminescence. As a result, resolution is increased and elements of submicron and micron size can be reproduced with greater fidelity.

In the case of positive resists, use is made for the light-sensitive agent of the components of o- and p-benzo- and naphthodiazoquinones or iminodiazoquinones and their derivatives which may be monomeric or polymeric, including hetero-organic, such as o-benzodiazoquinone, o-naphthodiazoquinone, sulfochloride, n-iminodiazoquinone, sulphoethers of o-naphthodiazoquinone, 4,4-dioxydiphenylmethane, sulphoether of halogenated (F, Cl, Br, I)o-naphthodiazoquinone and phenol, sulphoether of o-naphthodiazoquinone and trioxybenzophenone, sulphoether of o-naphthodiazoquinone and 2,2'-thiobis(4-chlorophenol), sulphoether of o-naphthodiazoquinone and pyrogallol, sulphoether of o-naphthodiazoquinone and mono- and diacylated tetraiodide phenyl propane. For negative resists, use is made of: oligomeric, polymeric and copolymeric compounds comprising groups having the structure

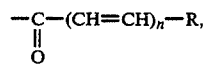

wherein R is C$_6$H$_5$ and n is an integer from 1 to 45, and combining with ester and ether groups; derivatives of said compounds; copolymers of vinyl oxycinnamate and β-vinyl oxyethylcinnamate and their derivatives; and copolymers of cinnamic, phenylbutadiene- and phenylhexatrienecarboxylic acids and their derivatives and vinyl acetate, vinyl chloride, vinylidene chloride, styrene, constituents of acryl esters and their derivatives, acetals, cyclorubbers and the like.

The film-forming agents of the resists of the invention are phenol-(naphthol)-formaldehyde or resol-aldehyde resins, polyacetals, products of condensation of phenols and 2-naphthols with aldehydes which contain unsaturated groups —(C=C)— and conjugate unsaturated groups —C=C)$_n$— where n is an integer from 1 to 5, copolymers of vinyl chloride and vinylidene chloride, polystyrene, low-molecular polymeric compounds with unsaturated groups —(C=C)$_n$— where n is an integer from 1 to 5, or derivative of the latter in combination with resol-aldehyde (resol-novolac) resins.

The negative photo- and electron-resists of the inventionn comprise, for example, the following sensitizers: Michler ketone; derivatives of mono- and diorganic esters, including hetero-organic; derivatives of monomeric anthraquinones, nitro compounds and thioazoline. The sensitizer amounts to 3 to 10 weight percent of the weight of the dry light-sensitive agent. A specific sensitizer and its amount are selected in accordance with its energy characteristic and reaction capability related to chemical interaction with ligh-sensitive agents and organic solvents. In the case of the three-level model, the singlet level of the sensitizer energy must be somewhat greater than the triplet energy level of the light-sensitive agent. The closer the sensitizer singlet level with respect to the triplet level of the light-sensitive agent, the higher the sensitizer energy transfer to the latter and the higher is the resist sensitivity.

The organic solvents for the resists of the invention are, for example, dioxane, dimethylformamide, cyclohexanone, toluene, chlorobenzene, and methyl ethyl ketone, taken on a separate basis or in various combinations. The selection of a certain organic solvent depends on the solubility of very diverse light-sensitive agents, film-forming compounds and sensitizers and also on its reaction capability related to the above substances and reaction products thereof.

The percent content of the constituents of the compositions of the invention is determined by a condition in which a most optimum process of forming elastic films on substrates is achieved, said substrates comprising, for example, semiconductor materials, dielectrics or metals. This means that in such a process individual constituents are not allowed to crystallize out. In addition, said percent content influences the wetting of the developed resist with aggressive media. Moreover, with due percent content mentioned above, the elastic resist films of a minimal thickness resist long-term action of aggressive media, which takes place, for example, during the etching step, and also the action of elevated temperatures. Therefore, the dimensions of the lines of the produced image depend to a greater extent on proper percent content of the constituents.

According to the present invention, the light-sensitive and film-forming constituents are taken in a ratio of 1.0:0.5–4.0, preferably 1.0:1.5. Note that an increase in the weight percent of the film-forming constituent provides for better film-forming ability of positive resists.

The photo- and electron resist of the invention should comprise from 5 to 10 weight percent of a light-sensitive constituent, from 10 to 15 weight percent of a film-forming constituent, from 0.5 to 1.0 weight percent of a sensitizer (in negative resists), from 0.1 to 3.0 percent of an additive, and from 86 to 94.4 and 78 to 84.9 percent of an organic solvent for negative and positive resists, respectively.

It has been found that the donor-acceptor complexes formed promote the stability of the solutions of photo- and electron-resists, negative and positive, as well as films based on them, with the result that the shelf life of the proposed compositions is increased considerably. The resists of the invention offer stable operation during one year.

When the donor-acceptor complexes are formed, there results an energy exchange between the donor molecules (represented by the light-sensitive and film-forming constituents and the products of resist reactions) and the acceptor molecules (the additive).

As a result, a considerable amount of energy is removed from the donor molecules, that energy being consumed during the collision of the donor and acceptor molecules and to change the vibrational and rotational energy levels in the entire donor-acceptor system, rather than for production of luminescence effect. The presence of additives of different weight percent of the combined weight of the dry constituents of the proposed resists allows for complete elimination of luminescence resulted from the derivatives of ethers of o-diazoquinones, derivatives of phenol-aldehyde resins and reaction products in positive resists, and also from polyesters with double bonds and conjugate double bonds, in an excited state in negative resists.

The Examples given below provide for better understanding of the present invention.

EXAMPLE 1

A solution is prepared employing 7.5 g of sulphoether of 2,1-naphthodiazoquinone and trioxybenzophenone, 12.5 g of novolac resin, 0.5 g of iodine, and 79.5 g of dioxane. The prepared solution is applied, with the aid of a whirler operating at 3000 r.p.s., on to a substrate of gallium arsenide within a period of time of 3–5 seconds. The substrate with a layer of a positive resist so produced is pre-baked at 50°–60° C. for 10 minutes. After pre-baking, the positive resist is subject to ultraviolet light through a mask having element size of 0.5 μm, with gaps between contour lines of 1.0 μm. The exposure time is 12 seconds and irradiance is $1.10^3$ W/cm$^2$, approx. The exposed resist is developed in 0.5 percent solution of caustic potash, is washed in water and is then post-baked for 10 minutes at 130° C. The line width of the obtained pattern is 0.55 μm and the gap between the pattern lines is 0.95 μm, with the length of the lines amounting to about 200 μm. The complex-forming additive can be acknowledged by the spectral method which shows respective absorption bands characteristic of a donor-acceptor-complex, and also by the absence of luminescence effect.

EXAMPLE 2

A solution is prepared employing 7.5 g of sulphoether of o.diazoquinone and the products of condensation of phenol and formaldehyde, 12.5 g of novolac resin, 1.0 g of tetracyanoethylene, and 79 g of dioxane.

The steps of application, pre-baking, exposure and development are the same as per Example 1, but the post-baking requires a temperature of 140° C.

The line width of the obtained pattern is 0.50 μm and the gap between the pattern lines is 1.0 μm.

EXAMPLE 3

A solution is prepared employing 7.5 g of sulphoether of o-naphthodiazoquinone and 2,2'-thiobis (4-chlorophenol), 12.5 g of resol-novolac resin, 1 g of tetracyanoquinodimethane, and 79.0 g of a mixture containing identical amounts of dioxane and dimethylformamide.

The steps concerned with the application, pre-baking, exposure, development and post-baking are performed as per Example 1 except that the exposure of the positive resist so produced is 15 seconds.

The line width of the obtained pattern is 0.5 μm and the gap between the pattern lines is 1.0 μm.

EXAMPLE 4

A solution is prepared employing 7.5 g of para-iminodiazoquinone, 12.5 g of resol-formaldehyde resin, 1.0 g of trinitrophenol, and 79.0 g of a mixture containing identical amounts of dioxane and dimethylformamide.

The steps of application, pre-baking, exposure, development and post-baking are the same as per Example 1, but the exposure time is 17 seconds.

The line width of the obtained pattern is 0.55 μm and the gap between the pattern lines is 0.95 μm.

EXAMPLE 5

A solution is prepared employing 7.5 g of sulphoether of o-naphthodiazoquinone 4,4'-dioxydiphenylmethane, 12.5 g of resol-formaldehyde resin, 1 g of parabromanil, and 79.0 g of a mixture containing identical amounts of dioxane and cyclohexanone.

The steps of application, pre-baking, exposure and development are the same as per Example 1, but the post-baking step requires a temperature of 140° C.

The line width of the obtain pattern is 0.55 μm and the gap between the pattern lines is 0.95 μm.

EXAMPLE 6

A solution is prepared employing 7.5 g of sulphoether of o-naphthodiazoquinone and trioxybenzophenone, 12.5 g of phenol-formaldehyde resin, 1.0 g of tetracyanoethylene (5 weight percent of the weight of dry products), and 79.0 g of dioxane.

The steps of application, pre-baking exposure, development and post-baking are the same as per Example 1.

EXAMPLE 7

A solution is prepared employing 7.5 g of sulphoether of o-naphthodiazoquinone and pyrogallol, 12.5 g of phenol-formaldehyde resin, 0.5 g of iodine, 0.5 g of tetracyanoethylene, and 79.0 g of dioxane.

The steps of application, pre-baking exposure, development and post-baking are the same as per Example 1, but the exposure time is equal to 20 seconds in this case.

The line width of the obtained pattern is 0.45 μm and the gap between the pattern lines is 1.05 μm.

EXAMPLE 8

A solution is prepared employing 7.5 g of o-naphthodiazoquinone sulfochloride, 12.5 g of resol-novolac resin, 1.0 g of tetracyanoquinodimethane, and 79.0 g of dioxane.

The steps of application, pre-baking, exposure, development and post-baking are the same as per Example 1, but the exposure time for the produced positive resist is equal to 17 seconds.

The line width of the obtained pattern is 0.5 μm and the gap between the pattern lines is 1.0 μm.

EXAMPLE 9

A solution is prepared employing 7.5 g of sulphoether of o-naphthobenzoquinone and a product of condensation of phenol and formaldehyde, 12.5 g of a product of condensation of α-naphthol and propionaldehyde, 1.0 g of tetracyanoethylene, and 79.0 g of a mixture of dioxane and dimethylformamide taken in identical quantities.

The steps of application, pre-baking, exposure, development and post-baking are the same as per Example 1, but the exposure time for the produced positive resist is 20 seconds and the post-baking is performed at 145° C.

The line width of the obtained pattern is 0.55 μm and the gap between the pattern lines is 0.95 μm.

EXAMPLE 10

A solution is prepared embploying 7.5 g of sulphoether of o-naphthodiazoquinone and trioxybenzophenone, 12.5 g of a product of condensation of phenol and cinnamic aldehyde, 0.5 g of iodine, and 79.5 g of dioxane.

The steps of application, pre-baking, exposure, development and post-baking are the same as per Example 1, but the exposure time for the positive resist produced is 18 seconds.

The line width of the obtained pattern is 0.5 μm and the gap between the pattern lines is 1.0 μm.

EXAMPLE 11

A solution is prepared employing 5 g of ester of polyvinyl alcohol and cinnamic acid, 0.5 g of Michler ketone, 0.5 g of tetracyanoquinodimethane, and 94.0 g of a mixture of toluene and chlorobenzene taken in a ratio of 3:1.

The solution produced is applied, with the aid of a whirler operating at 3000 r.p.s. on a substrate of gallium arsenide within a period of time of 3-5 seconds. The substrate with a layer of a negative resist of a thickness of 0.45 μm is pre-baked at 50°-60° C. for 10 minutes. After pre-baking, the negative resist is subject to ultraviolet light through a mask having an element line size of 0.5 μm, with gaps between contour lines of 1.0 μm. The exposure time is 20 seconds and irradiance is $1.10^3$ W/cm². The exposed resist is developed in 0.5 percent solution of caustic potash, is rinsed in water and is then post-baked at 130° C. for 10 minutes.

The line width of the obtained pattern is 1.05 μm and the gap between the pattern lines is 0.95 μm.

EXAMPLE 12

A solution is prepared employing 5 g of copolymer of vinyl oxycinnamate and vinyl acetate, 0.5 g of Michler ketone, 0.5 g of tetracyanoethylene, 94.0 g of a mixture of toluene and chlorobenzene taken in a ratio of 3:1.

The steps of application, pre-baking, exposure, development and post-baking are the same as per Example 11, except that the layer thickness of the negative resist produced is 0.4 μm and the exposure time is 17 seconds.

The line width of the obtained pattern is 1.0 μm and the gap between the pattern lines is 1.0 μm.

EXAMPLE 13

A solution is prepared employing 5 g of copolymer of β-vinyl oxycinnamate and vinyl acetate, 0.5 g of Michler ketone, 0.5 g of trinitrophenol, and 94.0 g of a mixture of toluene and chlorobenzene taken in a volume ratio of 3:1.

The steps of application, pre-baking, exposure, development and post-baking are the same as per Example 11.

EXAMPLE 14

A solution is prepared employing 5 g of polystyrene cinnamate, 0.5 g of Michler ketone, 0.5 g of tetracyanoquinodimethane, 94.0 g of a mixture of toluene and chlorobenzene taken in a volume ratio of 3:1.

The steps of application, pre-baking, exposure, development and pre-baking are the same as per Example 11, except that the exposure time is 15 seconds.

EXAMPLE 15

A solution is prepared employing copolymer of phenylbutadienecarboxylic acid and methyl methacrylate, 0.5 g of Michler ketone, 0.5 g of tetracyanoethylene, and 94.0 g of dioxane.

The steps of application, pre-baking, exposure, development and post-baking are the same as per Example 11, except that the exposure time is 25 seconds.

INDUSTRIAL APPLICABILITY

The invention is suitable for use in microelectronics, optics, printing industry and in precise engineering where resists help to fabricate the structures of semiconductor devices and solid-state circuits, acoustic electronic components and photomasks, diffraction gratings and precise printing plates of high resolution. The development of microwave microelectronic devices requires resists of very high resolution since registered element of micron and submicron size are needed in this case.

We claim:

1. A film-forming photo-and electron-resist composition, comprising a resist formed from
   a light-sensitive compound selected from the group consisting of o-benzoquinone diazide, p-benzoquinone diazide, and o-naphthoquinone diazide, and
   a film-forming compound, said resist being present in an amount sufficient to react with actinic light,
   iodine as an additive which with said resist forms a donor-acceptor complex, said additive being present in an amount sufficient to react with said resist to form said complex and to thereby eliminate luminescence effect and to increase the resist stability, and
   an organic solvent in an amount sufficient to dissolve said resist and said additive.

2. The composition of claim 1, comprising
   from 5-10 weight percent of said light-sensitive compound, from 10–15 weight percent of said film-forming compound selected from the group consisting of phenol-aldehyde resin, and α-naphthol-aldehyde resin, from 78–84.9 weight percent of said organic solvent, and from 0:1–30.0 weight percent of said additive.

3. The composition of claim 1, comprising said additive in an amount of 15 weight percent or less of the combined weight of dry constituents within said composition.

4. The composition of claim 1, comprising said light-sensitive and film-forming compounds in weight ratios of about 4:1–1:4.

5. A film-forming photo- and electron-resist composition, comprising a resist formed from the light-sensitive compound o-naphthoquinone diazide and a film-forming compound, said resist being present in an amount sufficient to react with actinic light, iodine as an additive which with said resist forms a donor-acceptor complex, said additive being present in an amount sufficient to react with said resist to form said complex and to thereby eliminate luminescence effect and to increase the resist stability, and an organic solvent in an amount sufficient to dissolve said resist and said additive.

* * * * *